United States Patent [19]

Gerpheide

[11] Patent Number: 5,349,303
[45] Date of Patent: Sep. 20, 1994

[54] ELECTRICAL CHARGE TRANSFER APPARATUS

[75] Inventor: George E. Gerpheide, Salt Lake City, Utah

[73] Assignee: Cirque Corporation, Salt Lake City, Utah

[21] Appl. No.: 87,500

[22] Filed: Jul. 2, 1993

[51] Int. Cl.$^5$ .................. H01L 29/00; H03K 5/08; G05F 1/00
[52] U.S. Cl. ................... 330/257; 330/260; 330/148; 307/490; 307/494
[58] Field of Search ............ 330/148, 257, 260; 307/490, 494

[56] References Cited

U.S. PATENT DOCUMENTS

| | | | |
|---|---|---|---|
| 4,163,948 | 8/1979 | Rieger et al. | 330/260 |
| 4,528,684 | 7/1985 | Iida | 377/60 |
| 4,717,869 | 1/1988 | Koch et al. | 330/260 |
| 4,803,709 | 2/1989 | Kimata | 377/58 |
| 4,974,239 | 11/1990 | Miwada | 377/60 |
| 4,993,053 | 2/1991 | Itoh | 377/60 |
| 5,033,068 | 7/1991 | Imai | 307/353 |
| 5,073,908 | 12/1991 | Cazaux | 377/62 |
| 5,191,400 | 3/1993 | Miller | 257/245 |

Primary Examiner—William L. Sikes
Assistant Examiner—Fetsum Abraham
Attorney, Agent, or Firm—Thorpe North & Western

[57] ABSTRACT

A charge transfer circuit includes an input terminal for receiving an input electrical charge, a transconductance amplifier having first and second inputs including an inverting input, and first and second differential current outputs, and a multiple output stage circuit responsive to the differential current outputs for producing two or more electrical current output signals whose values are related to the values of the differential current outputs and to each other. Also included is a feedback loop for delivering one of the electrical current output signals to the inverting input of the transconductance amplifier, and an integrator for integrating another of the electrical current output signals to produce an output electrical charge whose value is related to the value of the input electrical charge.

8 Claims, 3 Drawing Sheets

ELECTRICAL CHARGE TRANSFER APPARATUS

BACKGROUND OF THE INVENTION

This invention relates to apparatus for transferring or delivery to an output terminal an electrical charge which is proportional to an electrical charge received on an input terminal.

Electrical charge transfer circuitry has application when it is necessary to measure or respond to electrical charges, and it is convenient or necessary to transfer such charges from one location to another with accuracy. Examples of such applications are capacitive position sensors, piezo-electric sensors, capacitive humidity sensors, electrostatic digitizing tablets, electrostatic field receivers, etc.

An exemplary prior art electrical charge transfer circuit is shown in FIG. 1 to include a capacitor feedback charge amplifier $A_1$ having an input for receiving an input charge $Q_{in}$ which is to be "transferred". A capacitor $C_g$ is shown coupled between the input of the amplifier $A_1$ and ground potential, to represent stray capacitance. A feedback capacitor $C_f$ is located between the output of the amplifier $A_1$ and the input thereof, and is in parallel with a switch $S_i$. The output of the amplifier $A_1$ is coupled via an output capacitor $C_0$ to an output load, in this case shown to be a voltage source $V_1$. This electrical charge transfer circuit is well known and widely used.

With the prior art charge transfer circuit of FIG. 1, an error in the output charge may be introduced if the output voltage varies which could occur if the output charge is being accumulated (integrated) on a capacitor. Also, a feedback capacitor is required in the prior art circuit and this dictates that certain integrated circuit fabrication processes must be used to fabricate the circuit. Such processes are typically more expensive and troublesome than if the feedback capacitor did not have to be fabricated with the circuit.

SUMMARY OF THE INVENTION

It is an object of the invention to provide an efficient, easy to fabricate, and accurate electrical charge transfer apparatus.

It is another object of the invention to provide such apparatus in which no feedback capacitor is required.

It is a further object of the invention to provide such apparatus capable of producing multiple electrical charge outputs which are linearly related to an input charge and to each other.

It is an additional object of the invention, in accordance with one aspect thereof, to provide such apparatus capable of producing a differential output charge from a differential input charge.

The above and other objects of the invention are realized in a specific illustrative embodiment of an electrical charge transfer circuit which includes an input terminal for receiving an input electrical charge, a transconductance amplifier having first and second differential inputs, and first and second differential current outputs, the first input being coupled to the input terminal and the second input being coupled to ground potential, and a multiple output stage responsive to the differential current outputs for producing two or more electrical current output signals whose values are linearly related to the values of the differential current output and to each other. A feedback loop is provided for supplying one of the electrical current output signals to the first differential input of the transconductance amplifier.

In accordance with one aspect of the invention, a current integrator is coupled to the multiple output stage for integrating another of the electrical current output signals to accumulate an output electrical charge whose value is related to the value of the input electrical charge.

BRIEF DESCRIPTION OF THE DRAWINGS

The above and other objects, features and advantages of the invention will become apparent from a consideration of the following detailed description in which.

DETAILED DESCRIPTION

Figure 1:
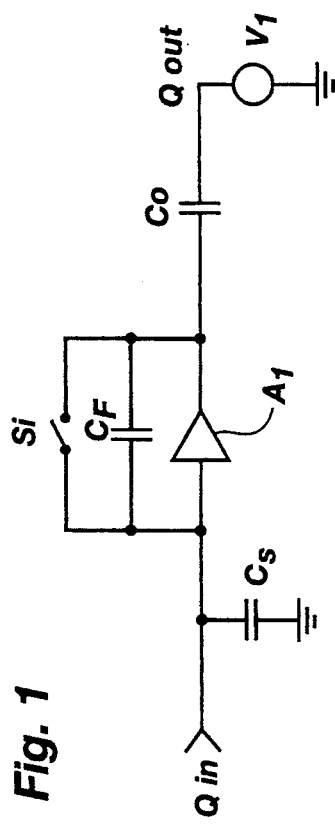
FIG. 1 is a schematic of a prior art electrical charge transfer circuit, already described.

FIG. 1, which shows a prior art approach to a charge transfer circuit, has been discussed earlier.

Figure 2:
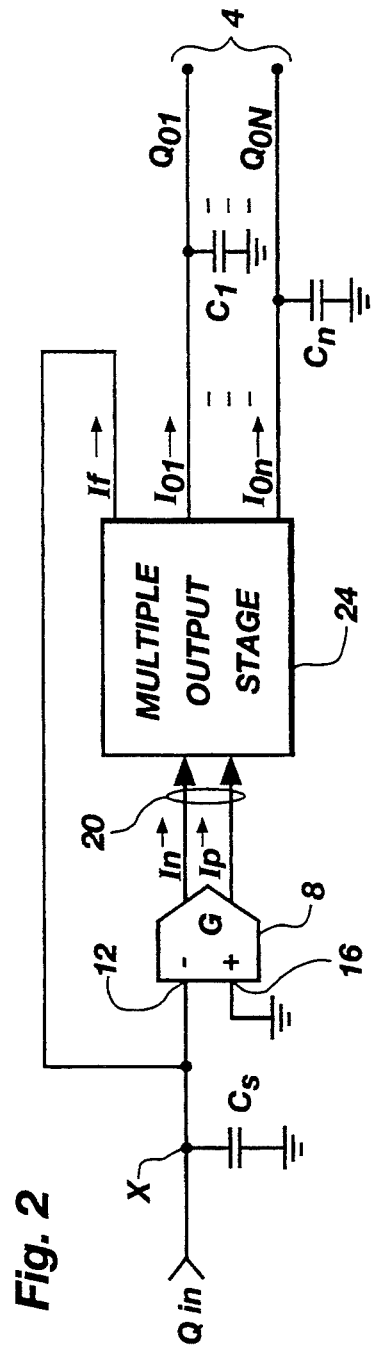
FIG. 2 is a schematic of an electrical charge transfer apparatus made in accordance with the principles of the present invention.

FIG. 2 shows a charge transfer circuit made in accordance with the present invention for receiving at a node x a charge $Q_{in}$ to be transferred to output terminals 4. The circuit includes a transconductance amplifier 8 having an inverting input 12 which is coupled to the node x, and a non-inverting input 16 which is coupled to AC ground. A capacitor $C_g$ is shown coupled between the node x and ground, to represent stray capacitance which may exist on the input node. The transconductance amplifier 8 has a transconductance gain of G and produces differential current outputs $I_n$ and $I_p$ on output terminals 20 (from the voltage input). These current outputs are related to the voltage developed at the node x, as follows:

$$I_p = G \times (V_{16} - V_x)$$

and $$I_n = -I_p,$$

where $V_{16}$ is the voltage at the non-inverting input 16 and $V_x$ is the voltage at node x.

The current outputs from the transconductance amplifier 8 are supplied to a multiple output stage circuit 24 which produces therefrom multiple output current signals $I_f, I_{o1}, \ldots I_{on}$. The current output signal $I_f$ is fed back to the node x and to the inverting input 12 of the transconductance amplifier 8. This feedback current "neutralizes" the input charge $Q_{in}$, and thus provides a measure of the value of the input charge.

The other current output signals $I_{o1}, \ldots, I_{on}$ are each integrated by a respective capacitor $C_1, \ldots, C_n$, to produce output charges $Q_{o1}, \ldots, Q_{on}$, respectively, and these are applied to output terminals 4. The output charges $Q_{o1}, \ldots Q_o$ are all linearly related to the input charge $Q_{in}$.

The transconductance amplifier 8 is a well known device. A transconductance amplifier with only an inverting input, could also be employed in the circuit of FIG. 2, in place of amplifier 8. Also, outputs 20 of the amplifier 8 could be "single-ended," with only $I_p$ output; in this case, of course, there would only be one input to the multiple output stage circuit 24. The multiple output stage circuit 24 may take a variety of configurations, one of which is shown in FIG. 3 and will be discussed momentarily.

In describing the operation of a charge transfer circuit of FIG. 2, assume that initially the voltage at node x is zero and that a positive charge $Q_{in}$ is supplied to the node. The voltage at the node x would thus increase by an amount corresponding to the magnitude of the input charge $Q_{in}$. This, in turn, produces a negative current on lead $I_p$ and a positive current $I_n$ on output leads 20. As a consequence, a negative current on lead $I_f$ is produced by the multiple output stage circuit 24 and flows on the feedback loop back to the inverting input 12 of the transconductance amplifier 8. This negative current causes the voltage at node x to decrease to zero and then differential current outputs $I_p$ and $I_n$, as well as feedback current If, all return to zero. During the time this is occurring, the integrated current on the feedback loop is $Q_f$ which equals $-Q_{in}$. The integrated currents on the other outputs of the multiple output stage circuit 24 are $$Q_{o1} = -K_1 \times Q_{in}$$
$$\ldots$$
$$Q_{on} = -K_n \times Q_{in}$$

where $K_1, \ldots K_n$ are constants. Thus, the charge transferred on each of the outputs of the multiple output stage circuit 24 is linearly related to the input charge $Q_{in}$.

Figure 3:
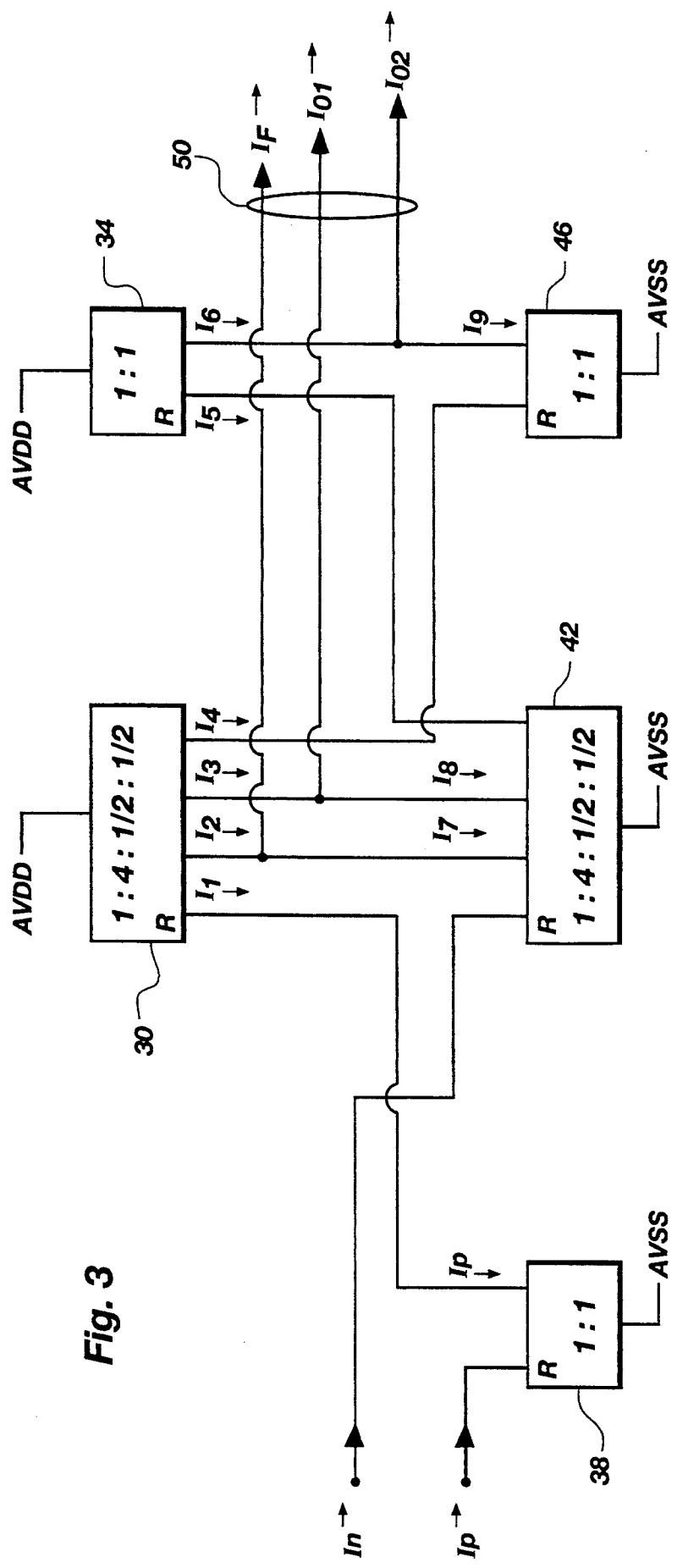
FIG. 3 is a schematic of one exemplary embodiment of the multiple output stage of FIG. 2.

FIG. 3 shows one embodiment of a multiple output stage circuit which may be utilized as circuit 24 in FIG. 2. This circuit includes a plurality of current mirrors 30, 34, 38, 42 and 46, in which current mirrors 30 and 34 are sourcing current mirrors and current mirrors 38, 42 and 46 are sinking current mirrors. What this means is that the source current mirrors act as sources of current (and the sinking current mirrors act as sinks for current) which are in direct ratio to each reference current. For example, in the sinking current. mirror 38, current $I_p$ is supplied to a reference input r of the mirror, and the mirror then accepts current $I_1$ which, in this case, is exactly equal to the reference current as indicated by the designation "1:1". That is, the indication "1:1" means a one to one ratio. The ratios for the different current mirrors are chosen to provide a particular set of relationships among the output currents supplied on leads For the particular current mirrors shown in FIG. 3, current mirror 38 dictates that $I_1=I_p$, current mirror 30 dictates that $I_2=4\times I_1$, $I_3=I_1/2$, and $I_4=I_1/2$, current mirror 46 dictates that $I_9=I_4$, current mirror 42 dictates that $I_7=4\times I_p$, $I_8=I_p/2$, $I_5=I_p/2$, and current mirror 34 dictates that $I_6=I_5$. Combining these equations we arrive at the following current values:

$$I_f=4\times(I_p-I_n)$$

$$I_{o1}=(I_p-I_n)/2=I_f/8$$

$$I_{o2}=(I_n-I_p)/2=I_f/8.$$

Thus, the output charges "transferred" by this circuit (when integrated) are:

$$Q_{o1}=(-\tfrac{1}{8})\times Q_{in}$$

$$Q_{o2}=(\tfrac{1}{8})\times Q_{in}.$$

It is apparent that other ratios could be created using various combinations of current mirrors to provide different charge "transfer" gains.

Figure 4:
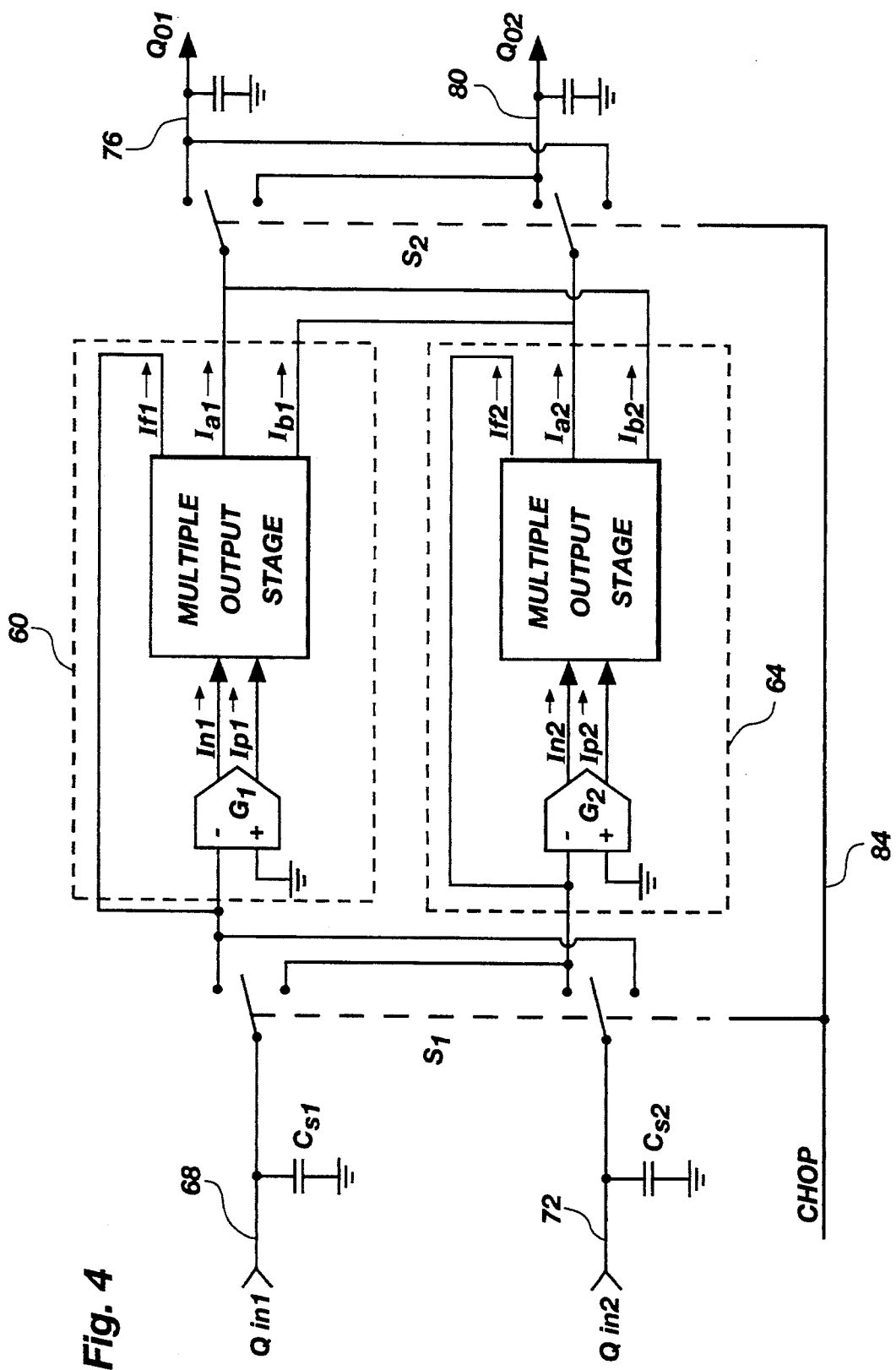
FIG. 4 is a schematic of a differential charge transfer circuit made in accordance with the principles of the present invention.

FIG. 4 is a schematic of a charge transfer circuit made in accordance with the principles of the present invention and arranged in a differential configuration. In other words, the difference in output charges is related to the difference in input charges. Differential circuit configurations are well known for high insensitivity to noise. The differential configuration of FIG. 4 has common mode rejection. If noise affects both input charges the same (i.e., it is common-mode), then that noise is "rejected" and does not affect the output charges (to the extent that circuit elements are ideal and perfectly matched.) Further, if common-mode noise is coupled by unintended coupling from some source to affect the absolute values of both output charges the same, the difference in output charges remains unaffected.

The circuit of FIG. 4 includes two sections 60 and 64, each of which include a transconductance amplifier ($G_1$ and $G_2$) and multiple output stages, similar to the configuration shown in FIG. 2, but with only three outputs from each of multiple output stages. The multiple output stages of the sections 60 and 64 might illustratively be the circuits shown in FIG. 3.

Two input terminals 68 and 72 are provided for receiving respectively an input charge $Q_{in1}$ and $Q_{in2}$. The two input terminals 68 and 72 are coupled to a double pole, double throw switch $S_1$ so that the input charges $Q_{in1}$ and $Q_{in2}$ may be selectively supplied to either transconductance amplifier $G_1$ and transconductance amplifier $G_2$ (when switch S is in the upper position) or to transconductance amplifiers $G_2$ and $G_1$ respectively (when switch $S_1$ is in the lower position). A second double pole, double throw switch $S_2$ is provided at the outputs of the sections 60 and 64 to connect to two output terminals 76 and 80. In particular, output $I_{a1}$ of the multiple output stage circuit of section 60 is coupled to the upper pole of switch $S_2$ and to the output $I_{b2}$ of the multiple output stage circuit of section 64. Also, the output $I_{a2}$ of section 64 is coupled to the lower pole of the switch $S_2$ and to output $I_{b1}$ of section 60. It can be seen that by appropriate setting of the switch $S_2$, the outputs of sections 60 and 64 can be applied either to output terminals 76 and 80 respectively or to output terminals 80 and 76 respectively.

When the switches remain in one setting, e.g., both switches $S_1$ and $S_2$ in the upper position, the differential output is $Q_{o1}-Q_{o2}=2\times k\times(Q_{in1}-Q_{in2})$, where k is a constant determined by the ratios in the multiple output stages of 60 and 64.

The switches $S_1$ and $S_2$ may be operated to both assume their upper positions, or both assume their lower positions, according to a chopping signal supplied by lead 84. By performing one charge transfer in the upper position followed by another in the lower position, the effects of non-ideal (mismatched) components can be cancelled in the net charge transfer which is the sum of the two transfers. An example of mismatched components causes the differential output resulting from transfer in the upper position to be $$Q_{o1}-Q_{o2}=(k_1\times Q_{in1}-k_2\times Q_{in2})+e,$$

where $k_1$ and $k_g$ are constants determined by the multiple output stages of 60 and 64, and e is an offset error term. This single transfer obviously does not show direct proportionality to the differential input. Transfer with switches in the lower position, assuming the same input charge as for the previous transfer, results in differential output of $$Q_{o1} = Q_{o2} = (k_2 \times Q_{in1} - k_1 \times Q_{in2}) - e.$$

The differential output charge which is the net of both transfers is given by summing the right sides of the preceding two equations and is $$Q_{o1} = Q_{o2} = (k_1 + k_2) \times (Q_{in1} = Q_{in2}),$$

which obviously shows direct proportionality to the differential input.

It is to be understood that the above-described arrangements are only illustrative of the application of the principles of the present invention. Numerous modifications and alternative arrangements may be devised by those skilled in the art without departing from the spirit and scope of the present invention and the appended claims are intended to cover such modifications and arrangements.

What is claimed is:

1. A charge transfer circuit comprising
   an input terminal for receiving an input electrical charge,
   transconductance amplifier means having at least an inverting input, and at least one differential current output, the input being coupled to the input terminal,
   means responsive to the differential current output for producing two or more electrical current output signals whose values are linearly related to the value of the differential current output and to each other, and
   feedback means for delivering one of the electrical current output signals to the input of the amplifier means.

2. A circuit as in claim 1 further comprising
   means for integrating another of the electrical current output signals to produce an output electrical charge whose value is related to the value of the input electrical charge.

3. A circuit as in claim 2 wherein, for a positive input electrical charge, the differential current output is positive, and wherein said one electrical current output signal is negative.

4. A circuit as in claim 2 wherein said integrating means comprises a capacitor.

5. A circuit as in claim 1 wherein said electrical current output producing means comprises a plurality of current mirrors for producing multiple current outputs whose values are related to the values of the differential current outputs, and to each other.

6. Differential charge transfer apparatus comprising
   first and second individual charge transfer circuits for receiving first and second input charges respectively, each of said charge transfer circuits including
      a transconductance amplifier having an inverting input for receiving the respective input charge, arid a differential current output,
      a multiple output stage means for developing at least three current output signals whose magnitudes are related to one another and are determined by the magnitude of the differential current output, and
      a feedback loop for supplying a first current output signal to said inverting input of the transconductance amplifier,
   first means for summing a second current output signal from the multiple output stage means of the first individual charge transfer circuit and a third current output signal from the multiple output stage means of the second individual charge transfer circuit, to produce a first summed current signal, and
   second means for summing a third current output signal from the multiple output stage means of the first individual charge transfer circuit and a second current output signal from the multiple output stage means of the second individual charge transfer circuit, to produce a second summed current signal.

7. Apparatus as in claim 6 further comprising
   first and second integrator means for producing first and second charges which are proportional to the first and second summed signals respectively.

8. Apparatus as in claim 7 further including
   first switch means for supplying the first and second input charges alternately to the first and second individual charge transfer circuits respectively and to the second and first individual charge transfer circuits respectively, and
   second switch means for supplying the first and second summed current signals alternately to the first and second integrator means respectively and to the second and third integrator means respectively.

* * * * *